United States Patent [19]

Arai

[11] 4,396,889

[45] Aug. 2, 1983

[54] NONADJUSTING BATTERY LIFE DETECTOR

[75] Inventor: Satoshi Arai, Tokyo, Japan

[73] Assignee: Kabushiki Kaisha Daini Seikosha, Tokyo, Japan

[21] Appl. No.: 213,619

[22] Filed: Dec. 5, 1980

[30] Foreign Application Priority Data

Dec. 22, 1979 [JP] Japan .................................. 54-167372

[51] Int. Cl.³ .............................................. G01N 27/46
[52] U.S. Cl. ....................................... 324/433; 307/362; 307/255
[58] Field of Search ................ 324/433; 307/362, 255; 340/661–663

[56] References Cited

U.S. PATENT DOCUMENTS 3,508,081  4/1970  Matsuda ............................. 307/255
3,725,681  4/1973  Frederiksen ........................ 307/362
3,733,498  5/1973  Watson .............................. 307/362

Primary Examiner—Michael J. Tokar
Attorney, Agent, or Firm—Robert E. Burns; Emmanuel J. Lobato; Bruce L. Adams

[57] ABSTRACT

A battery life detector operates by sensing battery voltage. The detector consists of a pair of series combinations of a constant voltage source and a constant current source which are connected to a terminal to which a battery voltage is applied. The constant voltage source outputs are connected to respective inputs of a differential amplifier.

4 Claims, 4 Drawing Figures

4,396,889

NONADJUSTING BATTERY LIFE DETECTOR

BACKGROUND OF THE INVENTION

This invention relates to a nonadjusting battery life detector which detects the battery life by detecting the voltage drop thereof.

A conventional nonadjusting battery life detector is shown in FIG. 1. A constant current source 3 is connected to a constant voltage source 2 and the output terminal thereof is connected to the reference voltage input terminal V+ of a differential amplifier 1. Therefore, a reference voltage having a particular voltage relative to ground G is supplied to the input terminal V+. On the other hand a battery voltage is divided by resistors $R_1$ and $R_2$ and a divided voltage is supplied to a comparison voltage input terminal V− of the differential amplifier 1 which detects the voltage drop of the battery. The variation $\delta V_D$ of the battery voltage is also divided by the resistors $R_1$ and $R_2$ and this divided variation is supplied to the comparison voltage input terminal V− of the differential amplifier 1, too. The variation of the detecting voltage for the battery life is determined by the sum of the first variation of the output voltage of the constant voltage source 2, the second variation from a design value of the voltage supplied to the reference voltage input terminal V+ of the differential amplifier 1 and the third variation from the design value of the comparison input voltage to the comparison voltage input terminal V−. Now, the second variation occurs because of the offset voltage of the differential amplifier 1. The variation of the detecting voltage for battery life is obtained by multiplying the variation from design value of the comparison input voltage by $(R_1+R_2)/R_2$.

Furthermore, when the nonadjusting battery life detector is used in a wrist watch having an integrated circuit which operates with low power, it is necessary to operate the nonadjusting battery life detector in a sampling operating mode in order to reduce the power consumption thereof. In the case that the sampling operating mode is used, a total variation is obtained by adding the variation from the design value of the voltage for detecting the battery life to the variation of the voltage drop ($V_{CE}$ sat) between the emitter and collector of transistor $T_{r1}$. For example, when the output voltage of the silver oxide battery drops from 1.57 volts to 1.4 volts, an output of the differential amplifier 1 having a battery life detector is designed so as to be inverted. In this case, the variation of detector voltage is about ±50 mV, that is the detector voltage is within 1.4 V±50 mV.

It is an object of present invention to remove the defect described above, that is, in the case that the nonadjusting battery life detector is operated in the sampling operating modes the variation from the design value of the detecting voltage for battery life is within ±25 mV.

DETAILED DESCRIPTION OF THE INVENTION

Figure 2:
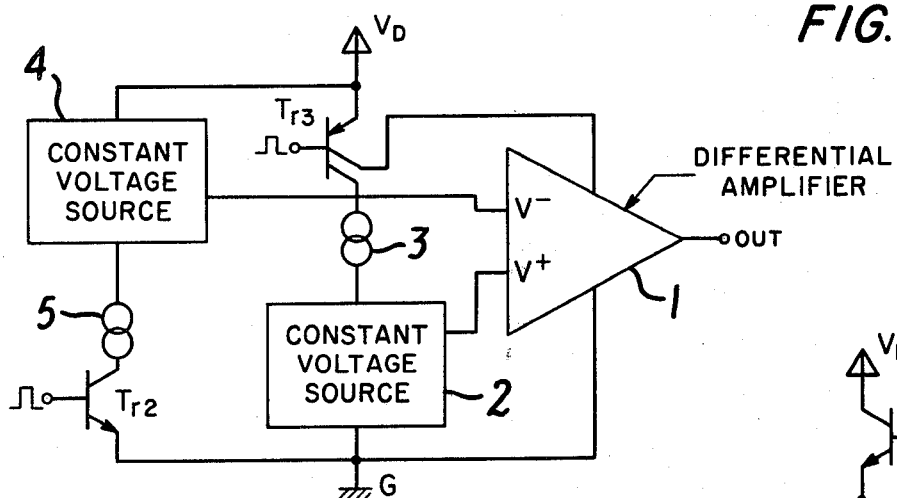
FIG. 2 shows the embodiment of nonadjusting battery life detector according to the present invention.

In FIG. 2 the constant voltage source 2 supplying the constant voltage to the reference voltage input terminal V− generates a constant voltage relative to ground G as in the conventional battery life detector. The output terminal of the constant voltage source which generates a constant voltage to the terminal of the battery voltage $V_D$ is connected to the comparison voltage input terminal V−. This connection is different from the conventional connection. Since the constant current sources 3 and 5 stabilize the output voltages of the constant voltage sources 2 and 4, respectively, the variations of the constant voltage sources 2 and 4 are easily maintained within ±10 mV of the design value.

Figure 1:
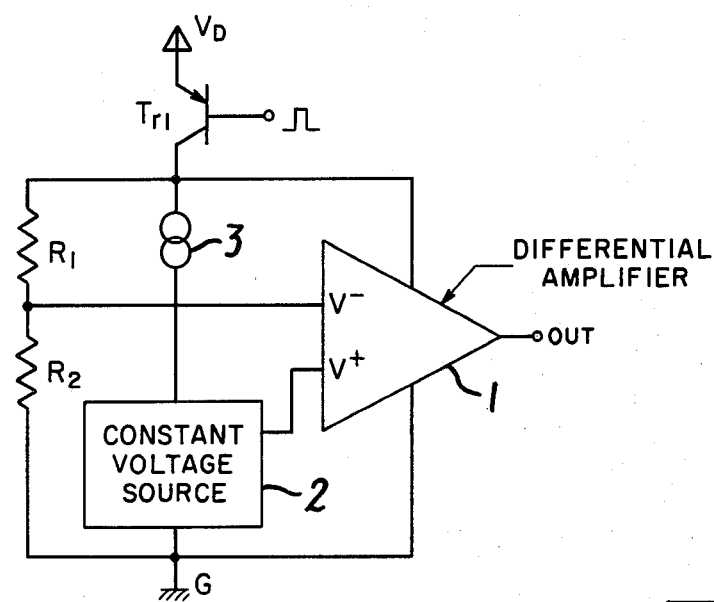
FIG. 1 shows the circuit diagram of the conventional nonadjusting battery life detector.
Figure 3:
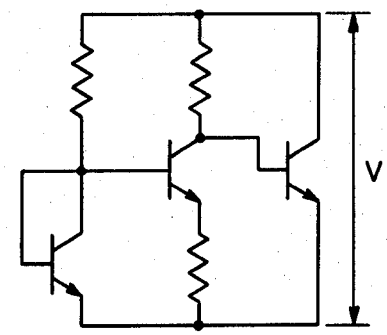
FIG. 3 shows the one example of the constant voltage source circuits.
Figure 4:
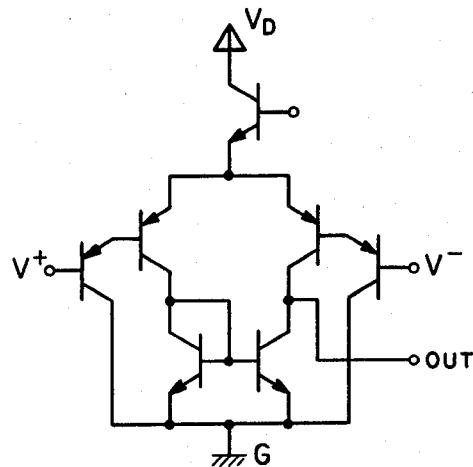
FIG. 4 shows the one example of the differential amplifier circuit.

Furthermore, the variations of voltage drop between an emitter and a collector of the transistors $T_{r2}$ and $T_{r3}$ for sampling the nonadjusting battery life detector do not affect the values of the constant output voltages of the constant voltage sources 2 and 4. Accordingly, the variation of battery life detecting voltage from design value is equal to the sum described below. It is calculated as the sum of the variation value ±10 mV from the design value of battery life detecting voltage, the variation value ±10 mV from the design value of the constant output voltage of the constant voltage source 2, the variation value ±10 mV of the constant voltage source 4 and the variation value 10 mV of the offset voltage of the differential amplifier 1 and the absolute value of it is less than 50 mV. FIG. 3 shows one example of the constant voltage source and the output voltage V thereof is about 1.205 volts. FIG. 4 shows one example of the differential amplifier.

Operation of the battery life detector according to the invention will now be made for the case that the detecting voltage for battery life is 1.4 volts. In FIG. 2 the output voltage of 0.2 volts from the constant voltage source 2 is supplied to the reference voltage input terminal V+. On the other hand, the potential difference (0.37 volts) between the output voltage (1.57 volts) of the silver oxide battery and the output voltage (1.2 volts) from the constant voltage source 4 is supplied to the comparison voltage input terminal V−. When the battery life of the silver oxide battery is coming rear, and the output voltage of the silver oxide battery began to drop from 1.57 volts, the voltage supplied to the comparison voltage input terminal V− also drops. This voltage drop is equal to the voltage drop of the output voltage of the silver oxide battery. When the output voltage thereof becomes 1.4 volts, the voltages supplied to the reference voltage and the comparison voltage terminals V+ and V− become 0.2 volts, respectively, and the output level OUT of the differential amplifier 1 is inverted.

As described above, according to this invention there is no bad influenced caused by the transistor for sampling the nonadjusting battery life detector. Futhermore, since two constant voltage sources having a small variation of output voltage to the variation of the manufacture and the variation (−20° C.∼60° C.) of temperature are used in order to compare the reference voltage with the comparison voltage precisely, the error from the design value of detecting voltage which determine the period of battery life is very small.

What is claimed:

1. Nonadjusting battery life detector characterized in that a first constant voltage source for generating a constant voltage relative to the ground is connected to a battery in series through a first constant current source, a second constant voltage source for generating a constant voltage is connected to the battery in series through a second constant current source, and the constant output voltages from the first and second constant voltage sources are supplied to the two input terminals of a differential amplifier, respectively.

2. Nonadjusting battery life detector as claimed in claim 1 characterized in that a first sampling transistor is connected between the second constant current source and the ground, a second sampling transistor is connected between the first constant current source and the battery, and a collector of the second sampling transistor is connected to the battery terminal of the differential amplifier.

3. A battery life detector, comprising:
a differential amplifier having a non-inverting input and an inverting input;
a terminal for connection, in use, to a battery for receiving a battery voltage to be detected;
a first constant voltage source having an output terminal connected to the non-inverting input of said differential amplifier for applying a constant voltage to the differential amplifier non-inverting input;
a first constant current source connected in series with said first constant voltage source for applying a constant current to said first constant voltage source;
a second constant voltage source having an output terminal connected to the inverting input of said differential amplifier for applying a constant voltage to the differential amplifier inverting input;
a second constant current source connected in series with said second constant voltage source for applying a constant current to said second constant voltage source; and
means for intermittently connecting the series combination of said first constant voltage source and said first constant current source to said terminal and for intermittently connecting the series combination of said second constant voltage source and said second constant current source to said terminal thereby to operate the battery detector circuit in a sampling operating mode.

4. A battery life detector according to claim 3, wherein said means for intermittently connecting is comprised of a first transistor having a collector-emitter path connected in series with said second constant current source and ground, and a second transistor having two collectors with a first collector-emitter path connected in series with said first constant current source and said terminal and with a second collector-emitter path connected in series with a power input of said differential amplifier and said terminal.

* * * * *